(12) United States Patent
Brugger et al.

(10) Patent No.: US 8,608,146 B2
(45) Date of Patent: Dec. 17, 2013

(54) REINFORCED PIN FOR BEING USED IN A PIN CHUCK, AND A PIN CHUCK USING SUCH REINFORCED PIN

(75) Inventors: Michael Brugger, Millstatt (AT); Otto Lach, Treffen (AT); Dietmar Hammer, Treffen (AT)

(73) Assignee: Lam Research AG, Villach (AT)

( * ) Notice: Subject to any disclaimer, the term of this patent is extended or adjusted under 35 U.S.C. 154(b) by 740 days.

(21) Appl. No.: 12/642,141

(22) Filed: Dec. 18, 2009

(65) Prior Publication Data

US 2011/0148022 A1 Jun. 23, 2011

(51) Int. Cl.
*B23Q 3/00* (2006.01)
*B25B 11/00* (2006.01)

(52) U.S. Cl.
USPC ............................ 269/296; 269/903; 269/21

(58) Field of Classification Search
USPC .......................................... 269/903, 21, 296
See application file for complete search history.

(56) References Cited

U.S. PATENT DOCUMENTS

| | | | | |
|---|---|---|---|---|
| 4,213,698 A | * | 7/1980 | Firtion et al. | 355/77 |
| 4,357,006 A | | 11/1982 | Hayes | |
| 4,903,717 A | | 2/1990 | Sumnitsch | |
| 5,207,750 A | * | 5/1993 | Rapata | 411/38 |
| 5,322,079 A | | 6/1994 | Fukutomi et al. | |
| 5,374,829 A | * | 12/1994 | Sakamoto et al. | 250/453.11 |
| 5,513,668 A | | 5/1996 | Sumnitsch | |
| 5,630,977 A | * | 5/1997 | Catalanotti et al. | 264/318 |
| 5,690,454 A | * | 11/1997 | Smith | 411/30 |
| 5,876,288 A | * | 3/1999 | Jaskowiak | 464/181 |
| 6,435,200 B1 | | 8/2002 | Langen | |
| 6,435,798 B1 | | 8/2002 | Satoh | |
| 6,513,796 B2 | * | 2/2003 | Leidy et al. | 269/21 |
| 6,702,272 B2 | * | 3/2004 | Monvavage | 269/266 |
| 7,311,302 B1 | * | 12/2007 | Farlow et al. | 269/296 |
| 7,419,435 B2 | * | 9/2008 | Borges et al. | 464/181 |
| 7,726,637 B2 | * | 6/2010 | Stevenson et al. | 269/266 |
| 2003/0172955 A1 | | 9/2003 | Kuroda et al. | |
| 2004/0047720 A1 | | 3/2004 | Lerner | |
| 2004/0070415 A1 | | 4/2004 | Schneidewind et al. | |
| 2004/0203178 A1 | | 10/2004 | Lee et al. | |
| 2006/0156981 A1 | | 7/2006 | Fondurulia et al. | |
| 2006/0160253 A1 | | 7/2006 | Kim et al. | |
| 2008/0070707 A1 | * | 3/2008 | Yamamoto et al. | 464/182 |
| 2011/0097177 A1 | * | 4/2011 | Carnevali | 411/372.5 |
| 2011/0254236 A1 | | 10/2011 | Brugger et al. | |

FOREIGN PATENT DOCUMENTS

| | | |
|---|---|---|
| DE | 20022001 U1 * | 3/2001 |
| EP | 0456426 A1 | 11/1991 |
| EP | 0467623 A2 | 1/1992 |

(Continued)

OTHER PUBLICATIONS

Machine Translation of Patent DE 20022001 U1 by Michael Reichard.*

(Continued)

*Primary Examiner* — Monica Carter
*Assistant Examiner* — Nirvana Deonauth
(74) *Attorney, Agent, or Firm* — Young & Thompson

(57) ABSTRACT

Improved durability and longevity of spin chucks is achieved by using a composite support pin structure in which a pin body of a chemically inert plastic includes a hollow cavity containing an insert formed from a material whose Young's modulus is greater than that of the inert plastic.

15 Claims, 2 Drawing Sheets

(56) References Cited

FOREIGN PATENT DOCUMENTS

| | | |
|---|---|---|
| JP | 2002093890 A | 3/2002 |
| JP | 2006054289 A | 2/2006 |
| JP | 2009059867 A | 3/2009 |
| WO | 03006705 A2 | 1/2003 |
| WO | 03006705 A3 | 1/2003 |

OTHER PUBLICATIONS

Written Opinion, dated Oct. 31, 2011, in PCT/IB2010/055551.
Written Opinion, dated Oct. 31, 2011, in PCT/IB2010/055552.
European Search Report, dated Oct. 10, 2013, from corresponding EP application.

\* cited by examiner

REINFORCED PIN FOR BEING USED IN A PIN CHUCK, AND A PIN CHUCK USING SUCH REINFORCED PIN

BACKGROUND OF THE INVENTION

1. Field of the Invention

The invention relates to devices for processing wafer shaped articles, and more particularly to such devices having pin constructions. The invention also relates to pin constructions for use in such devices.

2. Description of Related Art

Devices for processing wafer shaped articles often include pins that support the articles either from below or laterally about the edge of the wafer.

Examples of such devices are described in the commonly-owned U.S. Pat. Nos. 4,903,717; 5,513,668; and 6,435,200, the entirety of which patents is hereby expressly incorporated by reference.

Devices such as these are often used in practice as spin chucks positioned in the process chamber of a single wafer wet processing apparatus, used in the processing of semiconductor wafers and the manufacture of semiconductor devices on such wafers. As these chucks are subjected to highly corrosive chemicals in use, they are typically formed from chemically relatively inert plastics such as polytetrafluoroethylene (PTFE) or polyvinylidene fluoride (PVDF).

SUMMARY OF THE INVENTION

The inventor has discovered that the support pins conventionally used in devices for processing wafer shaped articles are subjected to considerable stresses during use, which can serve to impair the reliability of the device and/or shorten its overall service life. As the capital investment in such devices is substantial, new constructions that improve the reliability of such devices and/or extend their service life can be of considerable value.

According to the invention a device for processing wafer shaped articles is equipped with support pins having a body formed of a chemically inert bulk material and defining a hollow cavity containing a different material whose Young's modulus is greater than that of the bulk material.

Devices equipped with such pins can endure a much higher number of processing cycles without failing than conventional devices.

BRIEF DESCRIPTION OF THE DRAWINGS

Other objects, features and advantages of the invention will become more apparent after reading the following detailed description of preferred embodiments of the invention, given with reference to the accompanying drawings, in which:

FIG. 2b is a sectional view of the pin module of FIG. 2a; and

FIG. 2c is a perspective view of the pin module of FIG. 2a.

DETAILED DESCRIPTION OF PREFERRED EMBODIMENTS

Figure 1:
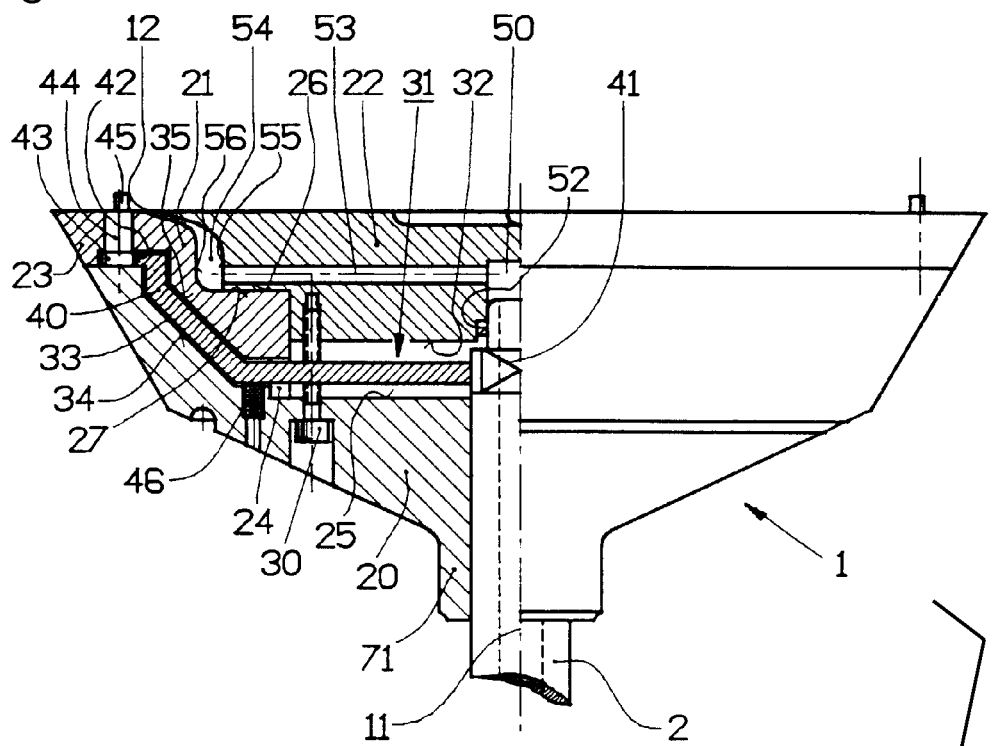
FIG. 1 is a side view, partly in vertical section, of a device for treating wafer shaped articles according to an embodiment of the invention.
Figure 1:
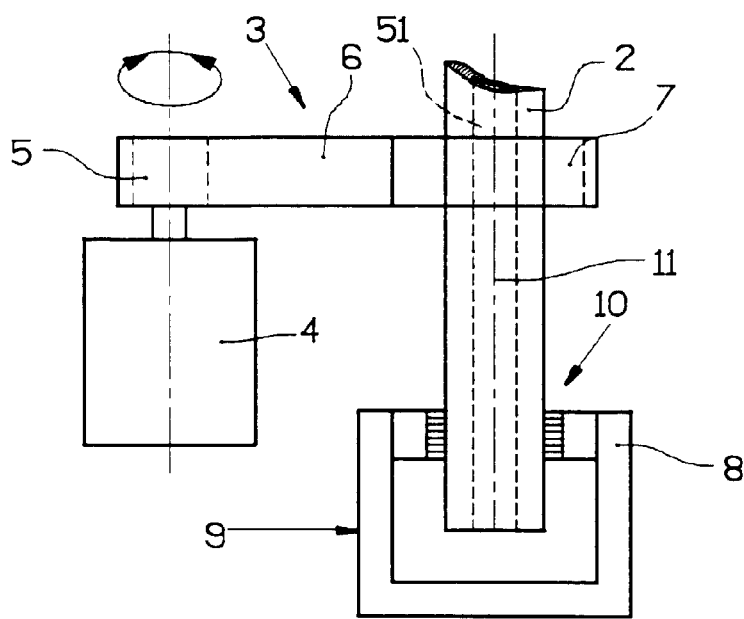

In FIG. 1, a support 1, intended for holding a wafer-shaped article, especially while the latter is treated with a treatment fluid (for etching of silicon wafers), is mounted on a hollow supporting shaft 2 and can be set into rotation about its axis 11 by this shaft; for this purpose, a rotary drive mechanism 3 is provided (compare U.S. Pat. No. 4,903,717).

The rotary drive mechanism 3 includes a drive motor 4, the output pinion 5 of which is coupled by way of a toothed belt 6 with a gear wheel 7 fixedly attached to the supporting shaft 2.

In order to feed gas under pressure to the hollow supporting shaft 2, its lower end is accommodated in a cup-shaped member 8 to which is connected a compressed gas conduit 9 for the supply of a gas (for example nitrogen); this cup-shaped member 8 is sealed by a labyrinth seal 10 with respect to the lower end of the supporting shaft 2.

The support 1 includes a base member 20 having approximately the shape of a cup, an annular member 21, and a central member 22 of a substantially plate-shaped structure.

The annular member 21 is seated via an annular rib 23 at its outer periphery on the outer rim of the cup-shaped member 20. Furthermore, the annular member 21 is supported by way of, for example, circular-arc-shaped projections 24 on a surface 25 of the base member 20.

The central member 22 has a shoulder 26 resting on a step 27 of the annular member 21. The central member 22 is attached to the base member 20 by several clamping bolts 30. The annular member 21 is clamped in place between the base member 20 and the central member 22.

A space 31 is provided between the base member 20 and the central member 22, this space 31 being defined in the downward direction by the surface 25 of the base member 20 and in the upward direction by the surface 32 of the central member 22. A gap-shaped space 33 emanates from this space 31; this space 33 is defined by mutually facing surfaces 34 and 35 of the base member 20 and, respectively, of the annular member 21.

A gear rim 40 is accommodated in the space 31 and in the gap-shaped space 33, this gear rim 40 being coupled with the upper end 41 of the supporting shaft 2 and meshing with its radially outwardly extending peripheral teeth 42 with gear wheels 43 on shafts 44 which latter are received rotatably in bores in the annular member 21. Each shaft 44 carries a pin 45 arranged eccentrically to its axis of rotation. By turning the shafts 44 with the aid of the gear rim 40, the radial distance of the pins 45 from the axis of rotation 11 of the support 1 can be varied. The pins 45 serve as stops for the lateral retention of a wafer-shaped article (e.g. a silicon wafer) (not shown) held on the support 1.

The gear rim 40 is supported and guided by sliding blocks 6 inserted in the base member 20 in an annular distribution. These sliding blocks 46 are formed, for example, from polytetrafluoroethylene.

It should furthermore be noted that recesses, not shown, are arranged in the gear rim 40, the projections 24 of the annular member 21 and the clamping bolts 30 extending through these recesses. These recesses are dimensioned so that the gear rim 40 can be rotated with respect to the annular member 21 and thus the support 1 to such an extent that the pins 45 can be adjusted to the desired degree.

During the radial turning of the pins 45 by adjustment of the shafts 44, the base member 20 is braked by a braking device not illustrated in detail, which can be designed, for example, as described in U.S. Pat. No. 4,903,717, namely as a hose brake, and the supporting shaft 2 is rotated with respect to the support 1. By this relative motion between the support 1 and its supporting shaft 2, the shafts 44 of the pins 45 are likewise turned.

In place of the hose brake known from U.S. Pat. No. 4,903,717, the base member 22 can also be associated with a shoe brake.

A blind hole 50 is arranged in the central member 22 of the support 1; the supporting shaft 2 is received in this blind hole 50 with its upper end where the bore 51 in the supporting shaft 2 terminates. The upper end of the supporting shaft 2 is sealed with respect to the central member 22 by a gasket 52. The gas exiting from the bore 51 in the supporting shaft 2 and entering the space formed by the blind hole 50 flows via several radial bores 53 into an annular space 54 and from there to the nozzle 12 through which the gas leaves the support 1.

The annular space 54 is defined by mutually facing surfaces 55 and 56 of the central member 22 and, respectively, of the annular member 21.

It can be seen that the space 31 and the gap-shaped space 33 wherein the rotary drive mechanism for the eccentric pins 45 is housed are separated and sealed (by gasket 52) from the flow path of the compressed gas through the support (blind hole 50, bores 53, annular space 54) to the nozzle 12.

The pins 45 are made of bulk material that is relatively inert to the highly corrosive chemicals used in wafer wet processing, and are preferably a plastic such as polytetrafluoroethylene (PTFE), perfluoroalkoxy (PFA), polyphenylenesulfide (PPS), polyetheretherketone (PEEK), polystyrene/polyethylstyrene (PS/PES), ethylene tetrafluoroethylene (ETFE), polyvinylidene fluoride (PVDF), homopolymer of chlorotrifluoroethylene (PCTFE), fluorinated ethylene propylene (FEP), or ethylene chlorotrifluoroethylene (ECTFE). PTFE and PVDF are particularly preferred.

Figure 2A:
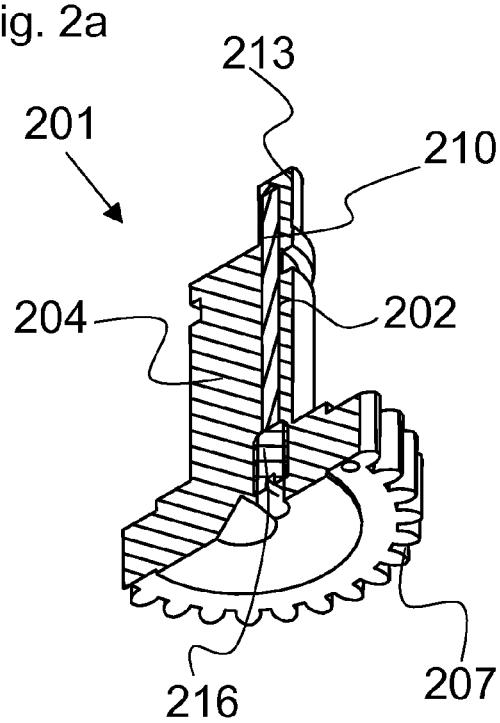
FIG. 2a is a view in perspective and partly in section illustrating an embodiment of a pin module for use in the chuck of FIG. 1.
Figure 2B:
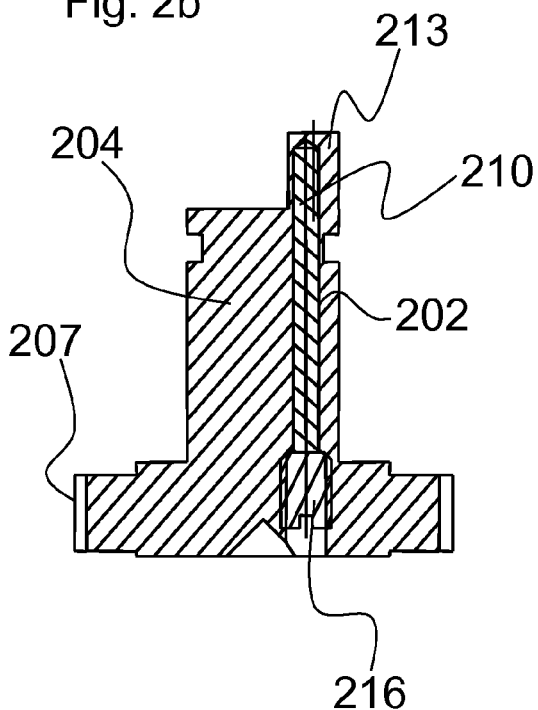
Figure 2C:
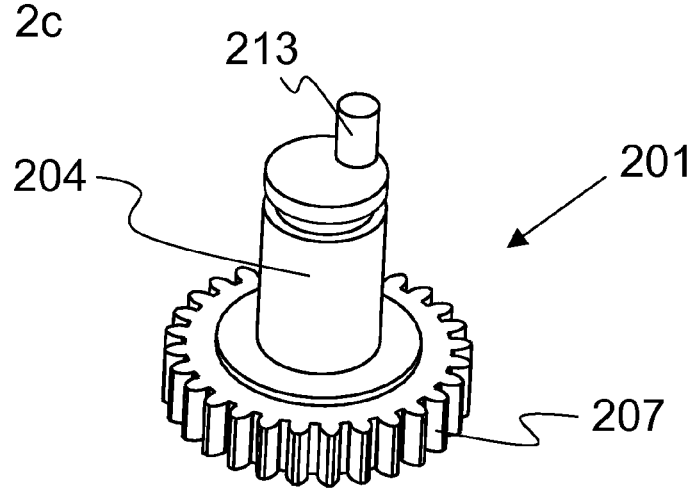

As shown in FIGS. 2a, 2b and 2c, the pins 45 may take the form of pin modules 201, which include gripping parts (213) that contact a wafer-shaped article either from below or laterally along the edge of the wafer. The construction of pins 45 described above is used for lateral contact with the edge of a wafer-shaped article, as for example is used in spin chucks that operate on the Bernoulli principle, where the wafer is held on a cushion of air but still should be constrained from lateral displacement.

As used herein the term "pins" also encompasses pin modules as depicted in FIGS. 2a, 2b and 2c. Pin module (201) comprises a tooth gear (207), shaft (204) and gripping part (213), all preferably formed of the above-described inert bulk material. The gripping parts (213) may be entirely cylindrical or may have a radially-inwardly facing scalloped surface part to assist in lifting the wafer from its edge, as is sometimes done to aid in expelling liquid between processing stages. In practice, the diameter of the gripping parts (213) is typically in the range of about 1 to about 5 mm, and most usually about 3 mm. When closing the pin modules (201) the gripping parts (213) grip the wafer and thus suffer a stress.

However, pin module (201) also includes a cavity (202) formed in shaft (204), for example a narrow hole that is drilled into the shaft (204) from a side that is not in liquid communication during a liquid treatment process carried out on a wafer when being gripped by the gripping parts (213) of the pins.

The cavity (202) is filled in this embodiment by a thin rod (210) that is preferably pressed into the cavity (202) so that almost no gap is left between the rod and the bulk material. In order to secure the rod (210) within the cavity (202), the cavity (202) is closed with a setscrew (216) is used. As the cavity (202) is a blind bore in this embodiment, the rod (210) is entirely covered by the bulk inert material on all surfaces within the gripping part (213).

The thin rod (210) has a higher Young's modulus (E) (or modulus or elasticity) than such a rod would have when made of the surrounding inert bulk material. Preferably the rod material is made of a carbon fiber reinforced composite; however, other materials are possible (e.g. stainless steel or titanium) depending on the process to be carried out on the wafer that is held by the pins.

The material occupying the cavity (202), whether a thin rod or some other type of insert or integrated material, preferably has a Young's modulus at least one order of magnitude greater than that of the surrounding bulk inert material (when expressed as $N/mm^2$), and more preferably has a Young's modulus that is at least two orders of magnitude greater than that of the surrounding bulk inert material, expressed as $N/mm^2$.

For example, PVDF has a Young's modulus of about 1.1 $kN/mm^2$ as measured by the ASTM D638 standard test method, whereas carbon fiber-reinforced plastic has a Young's modulus of about 124 $kN/mm^2$ to 152 $kN/mm^2$.

The hole (202) accommodating the rod (210) is preferably parallel to the axis of the shaft (204) and in the center of the gripping part (213) of the pin. However the hole might be slanted drilled, which is sufficient as long as the upper part of the hole is within the gripping part (213) of the pin.

The composite structure of the pins according to the invention provides enhanced durability and longevity to a chuck that incorporates them. For example, a chuck that would fail due to pin breakage after having gripped 100,000 wafers now lasts 1,000,000 wafers.

While the present invention has been described in connection with various preferred embodiments thereof, it is to be understood that those embodiments are provided merely to illustrate the invention, and should not be used as a pretext to limit the scope of protection conferred by the true scope and spirit of the appended claims.

What is claimed is:

1. Device for processing wafer-shaped articles, comprising a holder adapted to maintain a wafer-shaped article in a predetermined orientation during a processing operation to be performed on the article, and a plurality of support pins operatively engaged with the holder and adapted and positioned relative to the holder so as to support a wafer-shaped article to be processed on the device either from below or from an edge of the article, wherein said support pins comprise: a gear; a body formed of a chemically inert bulk material, wherein said body defines a hollow cavity and a gripping part adapted to contact a wafer-shaped article; and an insert positioned within said cavity formed of a material whose Young's modulus is greater than that of the bulk material.

2. The device according to claim 1, wherein the holder is a spin chuck surrounded by a process chamber for single wafer wet processing of semiconductor wafers.

3. The device according to claim 1, wherein the pins are positioned in a circular series surrounding an area where a wafer-shaped article is to be positioned on the holder, the pins being adapted to make edge contact with a wafer shaped article thereby to constrain in from lateral movement away from the predetermined position.

4. The device according to claim 1, wherein the bulk material is a chemically inert plastic.

5. The device according to claim 1, wherein the bulk material is selected from the group consisting of polytetrafluoroethylene (PTFE), perfluoroalkoxy (PFA), polyphenylenesulfide (PPS), polyetheretherketone (PEEK), polystyrene/polyethylstyrene (PS/PES), ethylene tetrafluoroethylene (ETFE), polyvinylidene fluoride (PVDF), homopolymer of chlorotrifluoroethylene (PCTFE), fluorinated ethylene propylene (FEP), and ethylene chlorotrifluoroethylene (ECTFE).

6. The device according to claim 5, wherein the bulk material is polytetrafluoroethylene (PTFE) or polyvinylidene fluoride (PVDF).

7. The device according to claim 1, wherein the insert is a carbon fiber reinforced composite.

8. The device according to claim 1, wherein the insert is stainless steel or titanium.

9. The device according to claim 1, wherein the insert has a Young's modulus at least one order of magnitude greater than a Young's modulus of said bulk material, expressed as $N/mm^2$.

10. The device according to claim 1, wherein the insert has a Young's modulus at least two orders of magnitude greater than a Young's modulus of said bulk material, expressed as $N/mm^2$.

11. A pin for use in devices for processing wafer-shaped articles, comprising: a gear; a body formed of a chemically inert bulk material, wherein said body defines a hollow cavity and a gripping part adapted to contact a wafer-shaped article; and an insert positioned within said cavity formed of a material whose Young's modulus is greater than that of the bulk material.

12. The pin according to claim 11, wherein the bulk material is selected from the group consisting of polytetrafluoroethylene (PTFE), perfluoroalkoxy (PFA), polyphenylenesulfide (PPS), polyetheretherketone (PEEK), polystyrene/polyethylstyrene (PS/PES), ethylene tetrafluoroethylene (ETFE), polyvinylidene fluoride (PVDF), homopolymer of chlorotrifluoroethylene (PCTFE), fluorinated ethylene propylene (FEP), and ethylene chlorotrifluoroethylene (ECTFE).

13. The pin according to claim 11, wherein the insert is a carbon fiber reinforced composite or stainless steel or titanium.

14. The pin according to claim 11, wherein the insert has a Young's modulus at least one order of magnitude greater than a Young's modulus of said bulk material, expressed as $N/mm^2$.

15. The pin according to claim 14, wherein the insert has a Young's modulus at least two orders of magnitude greater than a Young's modulus of said bulk material, expressed as $N/mm^2$.

* * * * *